(12) United States Patent  
Hackler, Sr. et al.

(10) Patent No.: US 9,209,047 B1
(45) Date of Patent: Dec. 8, 2015

(54) METHOD OF PRODUCING ENCAPSULATED IC DEVICES ON A WAFER

(71) Applicants: Douglas R. Hackler, Sr., Boise, ID (US); Dale G. Wilson, Kuna, ID (US)

(72) Inventors: Douglas R. Hackler, Sr., Boise, ID (US); Dale G. Wilson, Kuna, ID (US)

(73) Assignee: American Semiconductor, Inc., Boise, ID (US)

( * ) Notice: Subject to any disclaimer, the term of this patent is extended or adjusted under 35 U.S.C. 154(b) by 0 days.

(21) Appl. No.: 14/223,895

(22) Filed: Mar. 24, 2014

Related U.S. Application Data

(60) Provisional application No. 61/808,354, filed on Apr. 4, 2013.

(51) Int. Cl.
*H01L 21/56* (2006.01)
*H01L 23/31* (2006.01)

(52) U.S. Cl.
CPC ......... *H01L 21/561* (2013.01); *H01L 23/3135* (2013.01)

(58) Field of Classification Search
CPC . H01L 21/561; H01L 21/568; H01L 21/4832; H01L 23/3107
USPC .......................... 438/112, 113, 127
See application file for complete search history.

(56) References Cited

U.S. PATENT DOCUMENTS

| | | | |
|---|---|---|---|
| 4,872,825 A * | 10/1989 | Ross | 425/117 |
| 6,507,122 B2 | 1/2003 | Blackshear | |
| 6,787,394 B2 | 9/2004 | Farnsworth | |
| 7,728,445 B2 * | 6/2010 | Nakamura et al. | 257/790 |
| 8,114,771 B2 | 2/2012 | Jeon et al. | |
| 8,353,096 B2 | 1/2013 | Ladabaum | |
| 2005/0037534 A1 * | 2/2005 | Sawyer | 438/84 |
| 2011/0285009 A1 * | 11/2011 | Chi et al. | 257/693 |

* cited by examiner

*Primary Examiner* — Laura Menz
*Assistant Examiner* — Candice Y Chan
(74) *Attorney, Agent, or Firm* — Your Intellectual Property Matters, LLC; Robert A. Frohwerk

(57) ABSTRACT

This method of waferscale packaging produces finished integrated circuits (ICs) individually completely encapsulated with environmentally protective packaging material while still in the wafer format. Following conventional semiconductor fabrication of chips at the wafer level and prior to their separation, a first polymer is applied to the front surface of the wafer with allowance for contact holes. A carrier wafer is attached to the exposed polymer. The original substrate is removed and the devices are separated by cutting through the semiconductor layer and the first polymer. A second polymer is applied to cover the exposed backside of the devices and to fill the cut spaces between them, thereby sealing the remaining five surfaces of the chips. The second polymer layer may also include contact holes for access to the back side of the device chips. A second singulation cutting leaves the chips on the wafer prepared for a pick-and-place operation.

20 Claims, 4 Drawing Sheets

METHOD OF PRODUCING ENCAPSULATED IC DEVICES ON A WAFER

CROSS-REFERENCES TO RELATED APPLICATIONS

This application claims benefit of U.S. Provisional Application No. 61/808,354 filed Apr. 4, 2013, entitled "Waferscale Packaging", which is incorporated here by reference in its entirety.

FIELD OF THE INVENTION

The present invention relates generally to a method of manufacturing waferscale semiconductor devices. In particular, the described method produces semiconductor devices, flexible or rigid, that are completely encapsulated on the wafer without processing of individual die.

BACKGROUND OF THE INVENTION

Assembly of integrated circuits (ICs) is currently completed by thinning the silicon wafer, dicing or singulating the wafer into die, or chips, and then assembling the individual die into a package or applying them individually to a board that will be sealed for protection from the environment.

BRIEF SUMMARY OF THE INVENTION

The process of flexible waferscale packaging provides for the assembly of individual die while they are still in wafer form. This results in the die being fully assembled without any need for post-fabrication processing of individual die.

Flexible waferscale packaging utilizes wafers that have been processed using a wafer transfer technology. The most common example of this technology is Semiconductor-on-Polymer (SoP). The SoP process converts the top and/or bottom of the wafer surface to a polymer. When the polymer or similar material is compatible with the protection requirements of the die, it can be used as an exterior post-assembly material. However, SoP and conventional semiconductor wafer fabrication fail to make waferscale packaging feasible due to the fact that when the die are cut from the wafer the edges are not covered by the polymer or other assembly layer. The lack of a packaging material on the side of the die must be resolved in a post-singulated die assembly process in order to protect the edges.

In waferscale packaging this is done with a lower cost technique, before singulation, while the wafer is still intact. The SoP wafers enter into the waferscale assembly process prior to the step where they typically receive the top polymer coat. Instead of conventional processing, the wafer is subjected to dicing while still mounted on the carrier wafer. The semiconductor layer is cut using broad streets between the die. The die remains attached to the carrier wafer and the backside polymer may be diced or not. In either case the carrier wafer is not diced so that the wafer retains its form.

Following the cut to create the broad streets a topside polymer or similar assembly material is applied. This material coats the sides as well as the top of the die and creates a wafer of chips connected to each adjacent die by the polymer or packaging material. At this point, each die is sufficiently packaged as it is completely covered on all six surfaces with assembly material. The die, while still in the wafer form on the carrier, can be handled as part of a rigid wafer. Alternately, the waferscale assembly can be handled as a thin wafer following its demount from the carrier.

If desired the waferscale assembly may be diced prior to being demounted from the carrier. In this case, the saw or singulation cut is made through the middle of the broad street. The waferscale assembly is then demounted as it is released onto dicing tape as a collection of waferscale-assembled devices. Alternately, the wafers may be bonded to other wafers or to substrates for 3-D processing. Following this step, the singulated chips can be utilized using pick and place to populate circuit boards or similar electronic systems that require ICs. Furthermore, the waferscale assembled wafers may be applied to dicing tape after which they are diced in the conventional sequence.

BRIEF DESCRIPTION OF THE DRAWINGS

The particular features and advantages of the described methods and devices will become apparent from the following description taken in conjunction with one or more of the accompanying FIGS. 1-8 of the drawings.

Figure 1:
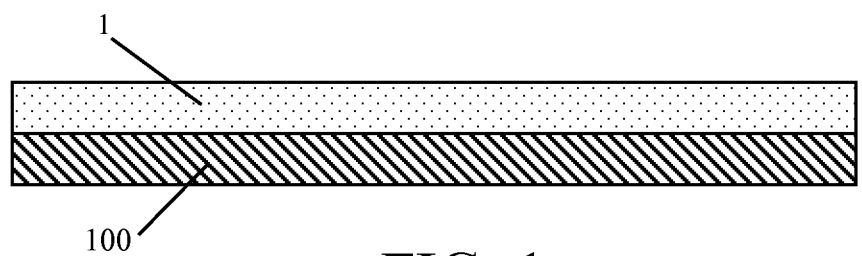
FIG. 1 depicts a generic starting wafer such as CMOS on a silicon substrate.

The following Reference Numbers may be used in conjunction with one or more of the accompanying FIGS. 1-8 of the drawings:

100 wafer layer
110 device layer
115 device
120 first polymer
130 contact hole, through first polymer
135 contact hole, through second polymer
140 carrier wafer
150 second polymer
160 dicing tape
200 fully formed encapsulated device

DETAILED DESCRIPTION OF THE INVENTION

The Waferscale Packaging (WSP) process described here begins as shown in FIG. 1 with a wafer layer 100. The described processes are well suited to Semiconductor-On-Insulator (SOI) substrates. For the purposes described here, this may be any semiconductor substrate, the most common being silicon or a III-V material such as gallium arsenide (GaAs). A device layer 110, such as CMOS, is applied to or created in the wafer layer 100, an SOI substrate being an example of a device layer created within a wafer layer. Standard semiconductor processing then proceeds to develop the desired Integrated Circuit (IC) devices. Though the illustrations may seem initially to suggest a particular topside versus bottom-side orientation, there is no such intent; it will be seen as the process progresses that it is totally independent of any top-bottom orientation.

Figure 2:
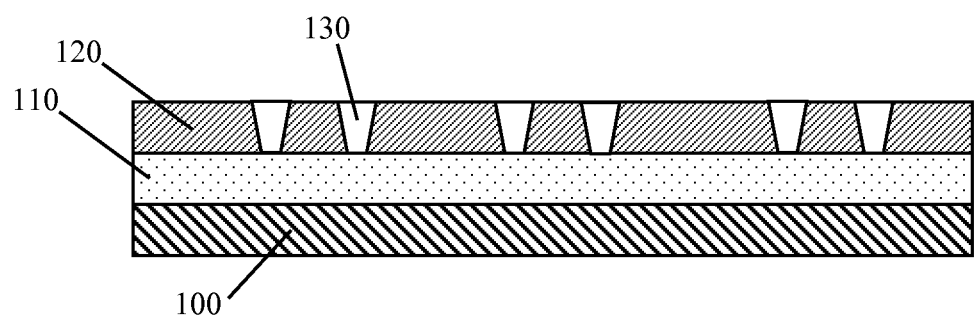
FIG. 2 illustrates the addition of a first polymer above the CMOS layer.

Following the completion of processing within the device layer 110, it is coated in FIG. 2 with a first polymer 120, such as a polyimide, as part of a known Semiconductor-on-Polymer (SoP) process. This polymer may be applied as a liquid or as a film. The polymer is intended to qualify as an assembly or package material applied directly to the surface of the wafer for proper sealing of the device layer. Where desirable, the polymer or assembly material may be a complex stack of materials rather than a single component. A first set of contact holes 130 may be formed into the first polymer 120 to provide access for external connections at the first surface of the device layer. When present, these contact holes 130 may be filled with a conductive filler material, such as a conductive epoxy, to provide external electrical contact while maintaining integrity of the seal.

Figure 3:
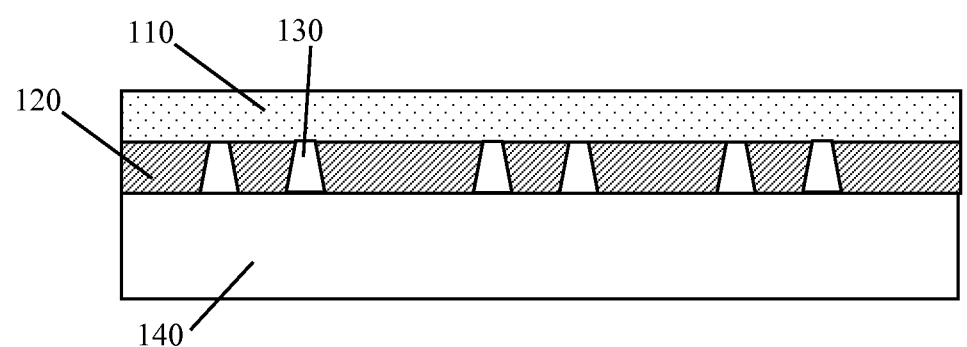
FIG. 3 shows the addition of a carrier wafer for support.
Figure 4:
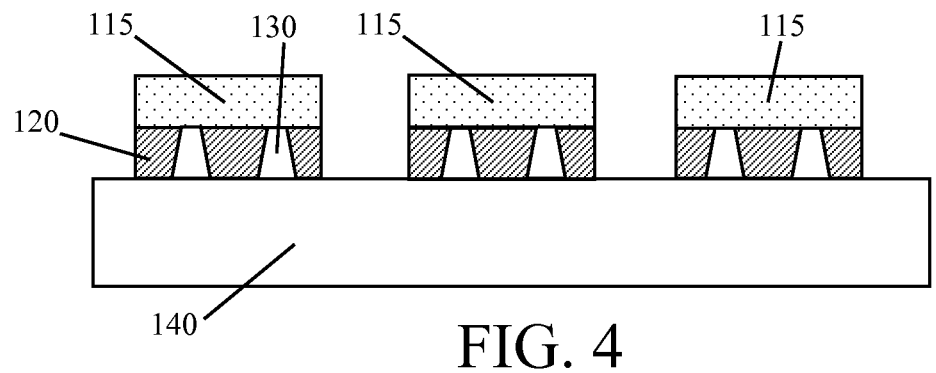
FIG. 4 shows the assembly of FIG. 3 after the individual device die have been separated.

The assembly at the stage of FIG. 2 is inverted and attached temporarily at its first polymer 120 to a carrier wafer 140 as shown in FIG. 3. Supported by the carrier wafer 140, the original wafer layer 100 is removed by any of various processes such as grinding, CMP (Chemical-Mechanical Polishing) or etching.

The individual IC devices 115 previously fabricated in device layer 110 are now separated by a dicing process step (FIG. 4) in which a broad street is cut between IC devices. Dicing is done in such a manner that the devices 115 remain attached to the carrier wafer 140 by the intervening first polymer 120. These cuts, whether by saw or laser or another means, expose the sides of the die without disturbing their position on the wafer.

Figure 5A:
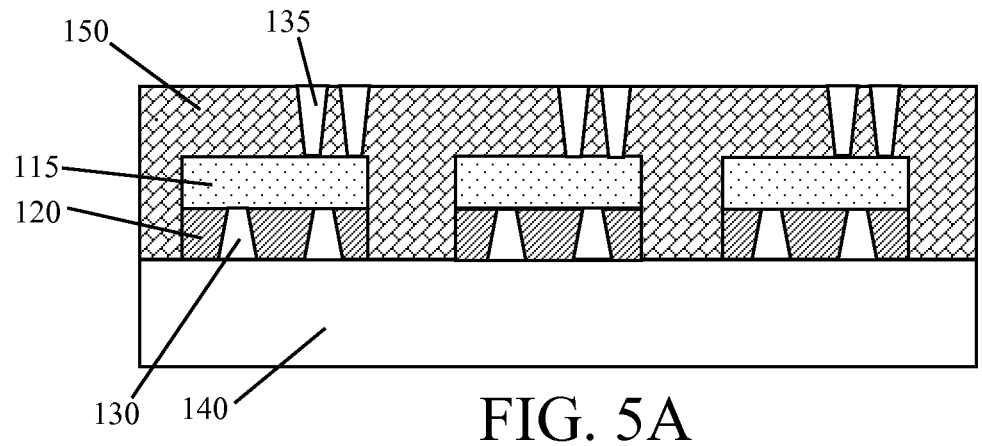
FIG. 5A illustrates sealing the assembly of FIG. 4 with a second polymer layer with subsequent dicing cuts through the second polymer (FIG. 5B), and alternately through the carrier wafer (FIG. 5C) as well.

A step to FIG. 5A shows the entire assembly coated by a second polymer 150 in keeping with the SoP process. As with the first polymer 120 this second layer may be a polymer or other suitable assembly material, applied as a liquid or film, or as a complex stack of materials. This step includes the formation of an optional second set of contact holes 135 through the second polymer 150 for access to connections at the second surface of the IC devices 115. It is to be noted that the second polymer 150 seamlessly combines with the first polymer and completely fills the spaces cut between the IC devices 115 by the dicing step so that each IC device 115 die is now fully encapsulated by polymer which covers the back and sides of the die.

Figure 5B:
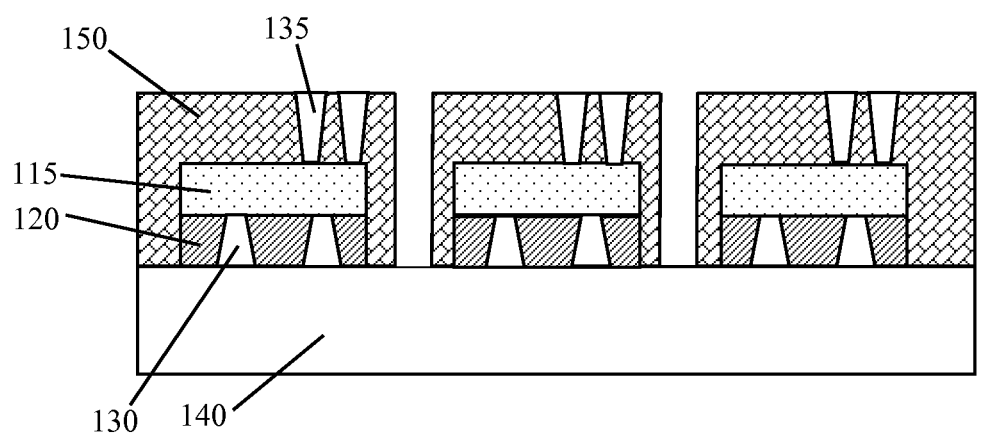
Figure 5C:
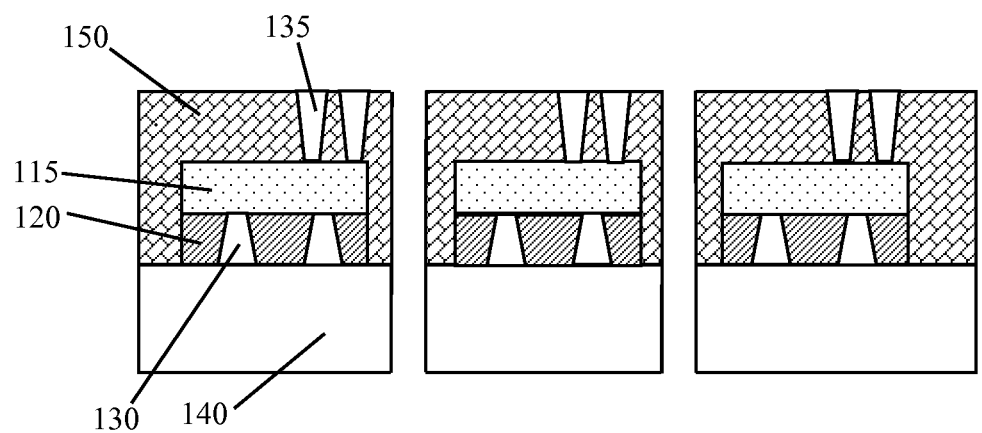

As originally formed, the IC devices 115 have been located on the wafer with adequate space between them, that is, with a sufficiently broad street, to allow a second cut within the boundaries of the dicing cut. This second cut, shown in FIG. 5B is through the second polymer but narrower than the broad street cut earlier so as to retain a sufficient thickness of the second polymer to serve as a suitable package material for protection of the die on all sides. At this point the IC devices are essentially islands of silicon completely surrounded by polymer, each being a waferscale-assembled device with its position and orientation maintained by its connection to a common substrate. The only exposure of the IC devices to the exterior being through holes in the polymers to allow electrical contact. Alternately, the second cut may be used to completely separate the IC devices by cutting entirely through the carrier wafer as shown in FIG. 5C.

The contact holes 135 may be filled with a conductive filler material, including epoxy or a conductive polymer, which seamlessly combines with the second polymer to maintain full encapsulation for integrity of the device package. While the second set of contact holes 135, as with the first set of contact holes 130, are optional depending upon the application of the die, when the contact holes are present they must be filled with a conductive filler material in order to enable electrical contact without loss of package integrity.

Figure 6:
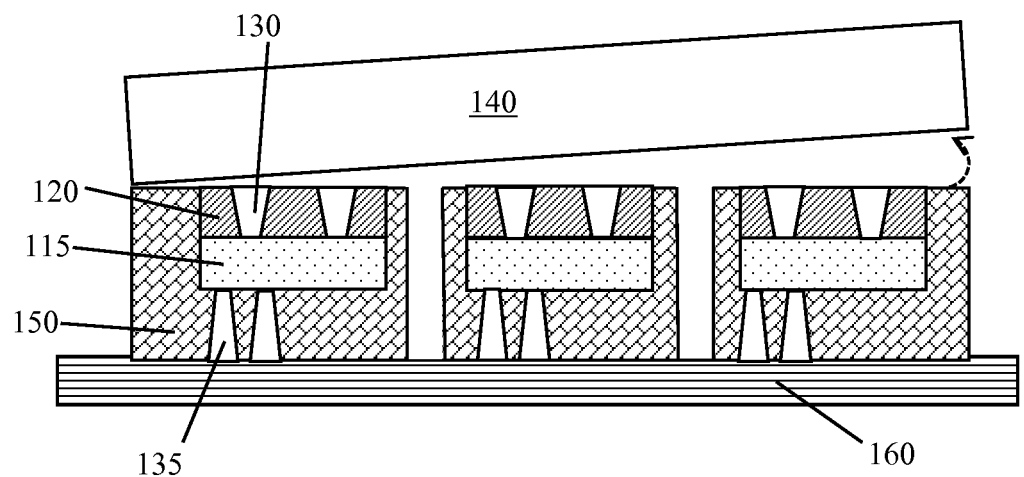
FIG. 6 depicts the addition of a dicing tape to provide support as the carrier wafer is removed.

A dicing tape 160 is now applied to the open surface of the second polymer 150, as shown in FIG. 6. At this point in the process the carrier wafer 140 is no longer needed. The waferscale assembly is demounted from the carrier wafer 140 onto the dicing tape 160, leaving the entire waferscale assembly as an intact collection of waferscale-assembled devices where the chips can be handled without loss of orientation. Supported by the dicing tape 160, demounting the carrier wafer 140 from the second polymer 150 is straightforward depending upon the type of bond between the two.

Figure 7:
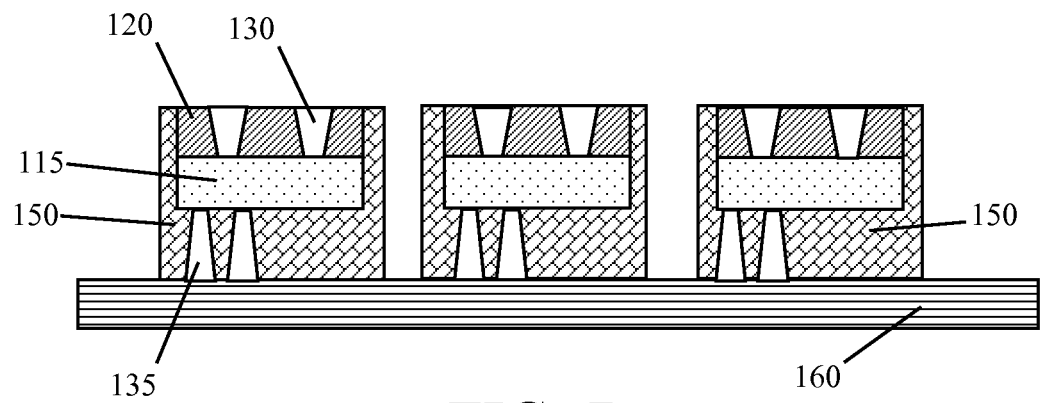
FIG. 7 illustrates separation of the device die by a second dicing operation.

Following separation from the carrier wafer 140, the waferscale assembly of die, supported by the dicing tape 160, is singulated by the second of two nested cutting steps as the polymer between the chips is cut to separate the individual IC devices 115. The cuts may be made by sawing or laser scribing or another operation that is compatible with the polymer. The result is depicted in FIG. 7 where packaging of the individual chips has been completed even as they remain attached by the second polymer 150 to the dicing tape as a complete wafer with both the front and backside contacts. Removal of the die (FIG. 8) from the dicing tape 160 by breaking the bond with the second polymer 150 leaves each individual IC device 115 as a fully formed encapsulated device 200, a waferscale-assembled device, protected by packaging material on all six sides. A standard process step such as pick-and-place accomplishes the removal phase of the waferscale packaging process as each die is transferred from the dicing tape 160 to a Printed Circuit Board (PCB) or flexible substrate.

Figure 8:
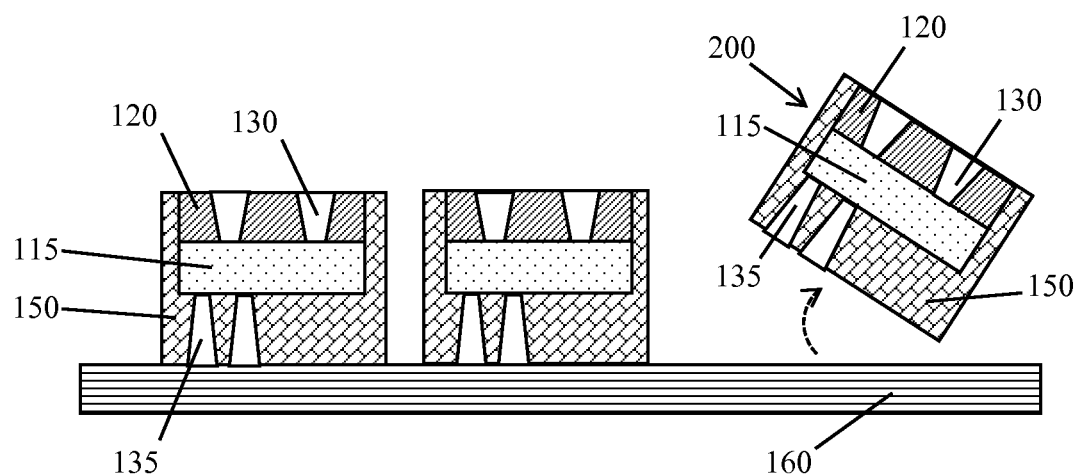
FIG. 8 depicts removal of an individual die from the dicing tape.

An alternative to the process described in FIGS. 6-8 is to forego the use of the dicing tape 160 and to retain the carrier wafer 140 so that it becomes a permanent part of the finished product. In such a case, the second of the cutting steps, that is, the one that cuts through the second polymer 150 to separate the individual IC devices 115, occurs immediately after FIG. 5. For applications where access to both sides of a device die is required it must ultimately be removed from the carrier wafer 140, otherwise the carrier may be cut at this step in the process or it may remain intact to facilitate further wafer level processing.

The method described here supports high-volume production at reduced cost. The temporary mounting on the carrier wafer enables the use of high-volume wafer processing equipment and material up to the point of processing singulated die, maintaining their exact wafer position throughout the assembly process, until the dicing tape mount takes over as a method of handling just prior to the use of the individual chips. Low-cost wafer processing can be used throughout the entire fabrication. The handling of individual chips is not required during assembly. Wire bonding and die attach operations can be eliminated.

As part of a SoP process the described method provides the ability to package flexible die as well as the capability for them to remain flexible after packaging. The described process may be applied to wafers of III-V or other materials as well as silicon, including alternative and non-crystalline materials such as silicon nitride, silicon carbide, poly silicon, amorphous silicon, gallium nitride, graphene, nanotubes, et cetera. Passive as well as active devices or a mix of each may be treated by these methods.

A minimal version of this method may be used for the encapsulation of any set of devices at the wafer level, protecting them with a suitable package material on all six sides, independent of the process steps for opening and filling contacts. The described process can be adapted to substrates having alternate shapes other than round, and for devices that are other than rectangular, as long as the material being packaged has the form of a sheet with a surface that will accept a packaging material that meets specific environmental requirements for the particular product being packaged.

In addition to the primarily flexible polymers described above, other packaging materials may be considered for properties of thermal conductivity to enable heat sinking, or for electrical properties including conductivity, or for transparency, that is, optical conductivity. Patterning of an encapsulating layer using a conductive material is one means of eliminating device connections. The use of an appropriate fill material in the contact holes accommodates photonic connectors at the waferscale package level.

What is claimed is:

1. A method of producing a waferscale assembly, comprising:
    acquiring a wafer layer;
    applying a device layer to the wafer layer;
    developing Integrated Circuit (IC) devices within the device layer;
    coating the device layer with a first polymer;
    attaching a carrier wafer to the first polymer;
    removing the wafer layer;
    dicing the IC devices with a first series of cuts to create a space that separates each one of the IC devices from each other of the IC devices, wherein the IC devices remain attached to the carrier wafer by the first polymer; and
    coating the device layer with a second polymer, wherein the second polymer seamlessly combines with the first polymer and fills the space that separates the IC devices, wherein each of the IC devices is fully encapsulated by a combination of the first polymer and the second polymer.

2. The method of claim 1, further comprising:
    forming a first set of contact holes into the first polymer prior to the step of attaching the carrier wafer.

3. The method of claim 2, further comprising:
    filling the first set of contact holes with a first conductive polymer,
    wherein the conductive polymer seamlessly combines with the first polymer.

4. The method of claim 2, further comprising:
    forming a second set of contact holes into the second polymer; and
    filling the second set of contact holes with a second conductive polymer,
    wherein the second conductive polymer seamlessly combines with the second polymer.

5. The method of claim 1, further comprising:
    making a second series of cuts from a surface of the waferscale assembly opposite the carrier wafer through the second polymer to separate each one of the IC devices from each other of the IC devices,
    wherein the second series of cuts is nested within the first series of cuts,
    wherein the second series of cuts is narrower than the first series of cuts to provide that each of the IC devices retains a sufficient thickness of the second polymer to protect each of the IC devices on all surfaces, and
    wherein each of the IC devices remains attached to the carrier wafer.

6. The method of claim 5, wherein the second series of cuts includes cutting through the carrier wafer.

7. The method of claim 1, further comprising:
    applying a dicing tape to the second polymer;
    demounting the waferscale assembly from the carrier wafer; and
    making a second series of cuts from a surface of the waferscale assembly opposite the dicing tape through the second polymer to separate each one of the IC devices from each other of the IC devices,
    wherein the second series of cuts is nested within the first series of cuts,
    wherein the second series of cuts is narrower than the first series of cuts to provide that each of the IC devices retains a sufficient thickness of the second polymer to protect each of the IC devices on all surfaces,
    whereby the waferscale assembly remains intact and the IC devices can be handled without loss of orientation.

8. The method of claim 1, wherein the wafer layer comprises a semiconductor substrate.

9. The method of claim 1, wherein a substrate includes the wafer layer and the device layer fabricated with the wafer layer.

10. The method of claim 9, wherein the substrate is Semiconductor-On-Insulator (SOI).

11. The method of claim 1, wherein each of the first polymer and the second polymer comprise a suitable package material.

12. The method of claim 1, wherein each of the first polymer and the second polymer is coated as a liquid or as a film.

13. The method of claim 1, wherein each of the first polymer and the second polymer is a complex stack of materials rather than a single component.

14. The method of claim 1, wherein the coating of the first polymer and the coating of the second polymer are part of a Semiconductor-on-Polymer (SoP) process.

15. The method of claim 1, wherein the step of removing the wafer layer includes one or more of grinding, Chemical-Mechanical Polishing (CMP), and etching.

16. The method of claim 1, wherein the step of dicing the IC devices includes cutting by saw or by laser to expose sides of the IC devices without disturbing positions of the IC devices on the wafer.

17. A method of producing a waferscale assembly, comprising:
    acquiring a wafer layer;
    applying a device layer to the wafer layer;
    developing Integrated Circuit (IC) devices within the device layer;
    coating the device layer with a first polymer;
    forming a first set of contact holes into the first polymer;
    attaching a carrier wafer to the first polymer;
    removing the wafer layer;
    dicing the IC devices with a first series of cuts to create a space that separates each one of the IC devices from each other of the IC devices, wherein the IC devices remain attached to the carrier wafer by the first polymer; and
    coating the device layer with a second polymer, wherein the second polymer seamlessly combines with the first polymer and in conjunction with the first polymer fills the space that separates the IC devices, leaving the first set of contact holes open.

18. The method of claim 17, further comprising:
    filling the first set of contact holes with a metal.

19. The method of claim 17, further comprising:
    forming a second set of contact holes into the second polymer; and
    leaving the second set of contact holes open.

20. The method of claim 17, further comprising:
    forming a second set of contact holes into the second polymer; and
    filling the second set of contact holes with a metal.

* * * * *